US010782322B2

(12) United States Patent
Hanley et al.

(10) Patent No.: US 10,782,322 B2
(45) Date of Patent: Sep. 22, 2020

(54) BUSBAR CURRENT SENSOR ASSEMBLY

(71) Applicant: Safran Electrical & Power, Blagnac (FR)

(72) Inventors: Kevin Francis Hanley, Bradenton, FL (US); Thomas Snyder, Bradenton, FL (US)

(73) Assignee: SAFRAN ELECTRICAL & POWER, Blagnac (FR)

( * ) Notice: Subject to any disclaimer, the term of this patent is extended or adjusted under 35 U.S.C. 154(b) by 593 days.

(21) Appl. No.: 15/487,340

(22) Filed: Apr. 13, 2017

(65) Prior Publication Data

US 2017/0322237 A1    Nov. 9, 2017

Related U.S. Application Data

(60) Provisional application No. 62/331,589, filed on May 4, 2016.

(51) Int. Cl.
*G01R 15/20* (2006.01)
*G01R 17/16* (2006.01)
(Continued)

(52) U.S. Cl.
CPC ........... *G01R 15/202* (2013.01); *G01R 17/16* (2013.01); *G01R 19/0092* (2013.01); *H01R 25/165* (2013.01); *G01R 1/04* (2013.01)

(58) Field of Classification Search
CPC ........ G01R 1/00; H01R 3/00; H01R 2101/00; H01H 1/00; H01H 45/00; H01H 63/00; H01H 69/00; H01H 2201/00; H01H 2203/00; H02B 1/00; H01M 2/00; H01M 2200/00; H01M 1/00; H02J 1/00;
(Continued)

(56) References Cited

U.S. PATENT DOCUMENTS 7,755,346 B2    7/2010  Tanizawa
8,142,237 B2    3/2012  Condamin et al.
(Continued)

FOREIGN PATENT DOCUMENTS

DE      10049071 A1    4/2002
JP      2013-113687 A  6/2013
(Continued)

OTHER PUBLICATIONS

Senis AG: "Bus-Bar Magnetic Sensor Module BBM-02 North American Distributor: GMW Associates", Apr. 1, 2016, XP055405536, Retrieved from the Internet: URL: http://c1940652.r52.cf0.rackcdn.com/57befe9dfl2a7c38fb0017ab/bus-bar-module-bbm-02-current-sensor-datasheet_ver3.pdf.
(Continued)

*Primary Examiner* — Jermele M Hollington
*Assistant Examiner* — Temilade S Rhodes-Vivour
(74) *Attorney, Agent, or Firm* — Rankin, Hill & Clark LLP (57) ABSTRACT

A busbar current sensor assembly includes a busbar member that includes a first cavity and a second cavity. The second cavity is disposed opposite the first cavity. The busbar current sensor assembly also includes a first current sensor disposed in the first cavity such that the first cavity at least partially surrounds the first current sensor and a second current sensor disposed in the second cavity such that the second cavity at least partially surrounds the second current sensor.

20 Claims, 4 Drawing Sheets

(51) Int. Cl.
  *G01R 19/00* (2006.01)
  *H01R 25/16* (2006.01)
  *G01R 1/04* (2006.01)

(58) Field of Classification Search
  CPC ........ H02M 1/00; H02P 1/00; H02P 2101/00; H02P 2201/00
  See application file for complete search history.

(56) References Cited

U.S. PATENT DOCUMENTS

| | | | | |
|---|---|---|---|---|
| 2004/0174664 | A1* | 9/2004 | Werner | H02B 1/21 361/624 |
| 2011/0050260 | A1* | 3/2011 | Teramoto | G01R 31/364 324/705 |
| 2013/0058143 | A1* | 3/2013 | Tachibana | H02M 7/003 363/131 |
| 2014/0084914 | A1* | 3/2014 | Nakajima | G01R 15/207 324/252 |
| 2014/0192457 | A1* | 7/2014 | Zhao | B60R 16/0238 361/624 |
| 2015/0355241 | A1* | 12/2015 | Kawanami | G01R 15/20 324/117 R |

FOREIGN PATENT DOCUMENTS

| | | |
|---|---|---|
| JP | 2013-142623 A | 7/2013 |
| KR | 101413484 B1 | 7/2014 |
| RU | 110193 U1 | 11/2011 |
| SU | 1739307 A1 | 6/1992 |
| WO | 01/40812 A2 | 6/2001 |
| WO | 2013/124117 A1 | 8/2013 |
| WO | 2015/012314 A1 | 1/2015 |
| WO | 2015/115238 A1 | 8/2015 |

OTHER PUBLICATIONS

International Search Report and Written Opinion dated Oct. 13, 2017, 54 pages.
Russian Decision to Grant with English translation dated Jun. 17, 2020, 17 pages.
Russian Search Report with English translation dated Jun. 16, 2020, 4 pages.

* cited by examiner

BUSBAR CURRENT SENSOR ASSEMBLY

BACKGROUND

In the aerospace power distribution industry, power distribution boxes can include integral current sensing capability. Current sensors are frequently used to detect excessive fault currents so that an aircraft power distribution system can rapidly change operating modes to prevent damage and allow continued and safe operation of the aircraft.

When a current passes through a conducting wire, cable or busbar (hereinafter "conductor"), a magnetic field is generated that surrounds the conductor. A magnitude of the magnetic field is linearly related to the magnitude of the current. Thus, by detecting the magnitude of the magnetic field, the magnitude of the current can be determined.

There are a variety of methods to measure the magnetic field, and thus determine the current. Preferably, a magnetic field/current sensor is matched to the magnitude of the magnetic field created by the flowing current that is to be measured. This can be accomplished through a variety of methods. For example, one common method of matching the sensing component to the magnetic field is to use a toroidal ferrite core with a slit. Another method involves using shunt resistance in series. Alternatively, current sensors can be placed on opposite sides of the conductor, but a hole must be made in the conductor and the sensors must be precisely placed near the hole to reduce the magnetic field for proper measurement. However, these methods have a variety of disadvantages, and an improvement is needed.

SUMMARY

In view of the foregoing, a busbar current sensor assembly is provided that includes a busbar member. The busbar member includes a base that includes a first surface that faces in a first direction and a second surface that faces in a second direction. The first direction is opposite the second direction. The busbar member also includes a first boundary wall that extends from the first surface of the base in a direction away from the second surface. The first boundary wall and the first surface cooperate to define a first cavity. The busbar member also includes a second boundary wall that extends from the second surface of the base in a direction away from the first surface. The second boundary wall and the second surface cooperate to define a second cavity. The busbar current sensor assembly also includes a first current sensor disposed in the first cavity and a second current sensor disposed in the second cavity.

According to an aspect, a busbar current sensor assembly includes a busbar member that includes a first cavity and a second cavity. The second cavity is disposed opposite the first cavity. The busbar current sensor assembly also includes a first current sensor disposed in the first cavity such that the first cavity at least partially surrounds the first current sensor and a second current sensor disposed in the second cavity such that the second cavity at least partially surrounds the second current sensor.

DETAILED DESCRIPTION

Figure 1:
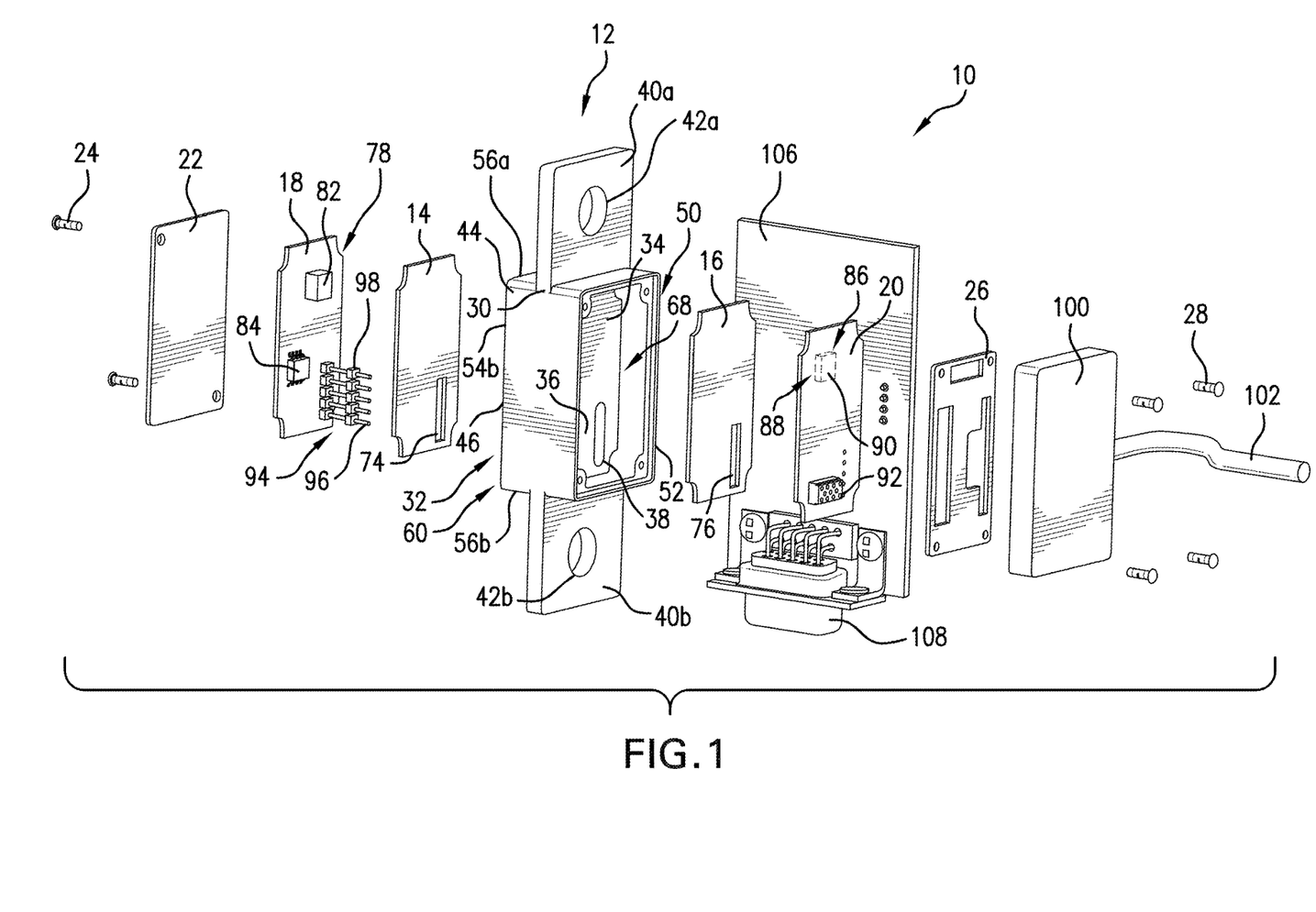
FIG. 1 is an exploded perspective view of a busbar current sensor assembly.

FIG. 1 depicts components of a busbar current sensor assembly 10. The busbar current sensor assembly 10 can include a busbar member 12, a first insulator 14, a second insulator 16, a first circuit board 18, a second circuit board 20, a first cover 22, first fasteners 24, a second cover 26, and second fasteners 28.

Figure 2:
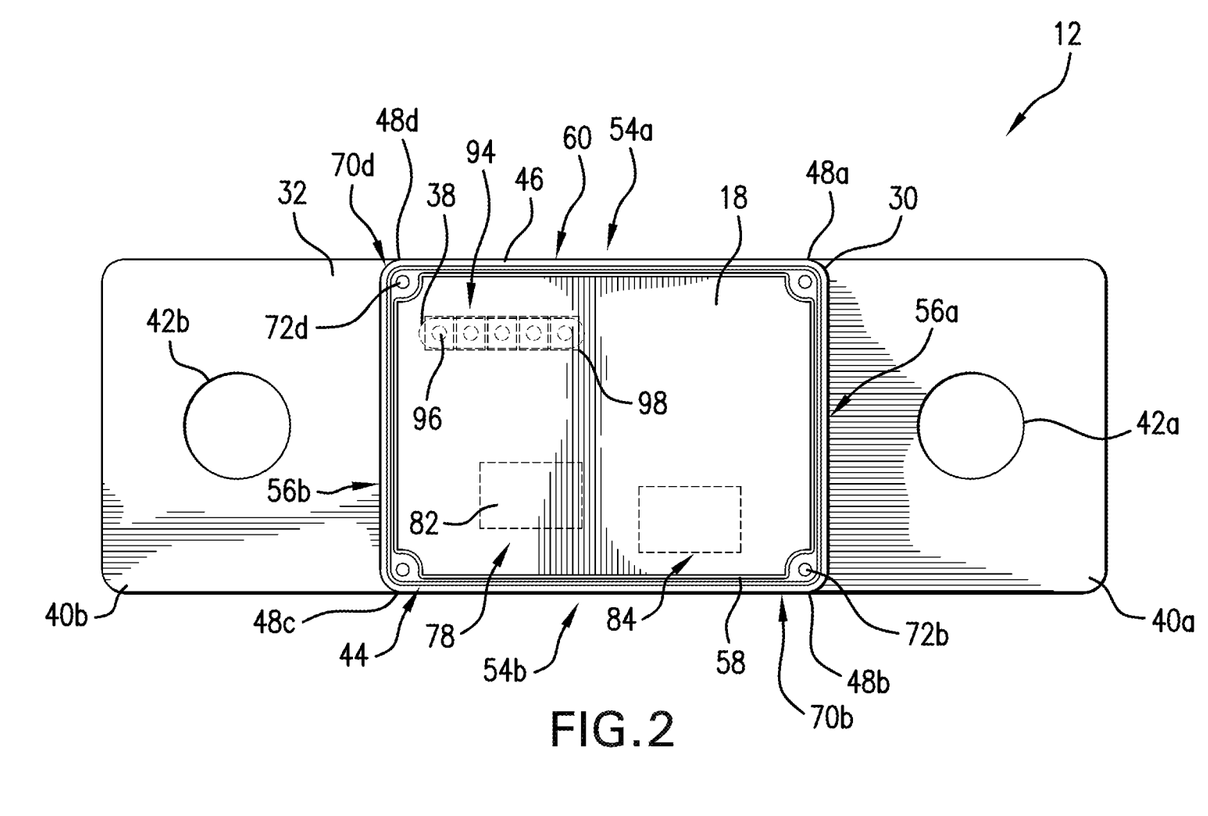
FIG. 2 is a plan view of a first surface of a busbar member with a first circuit board installed therein with a first cover removed.
Figure 3:
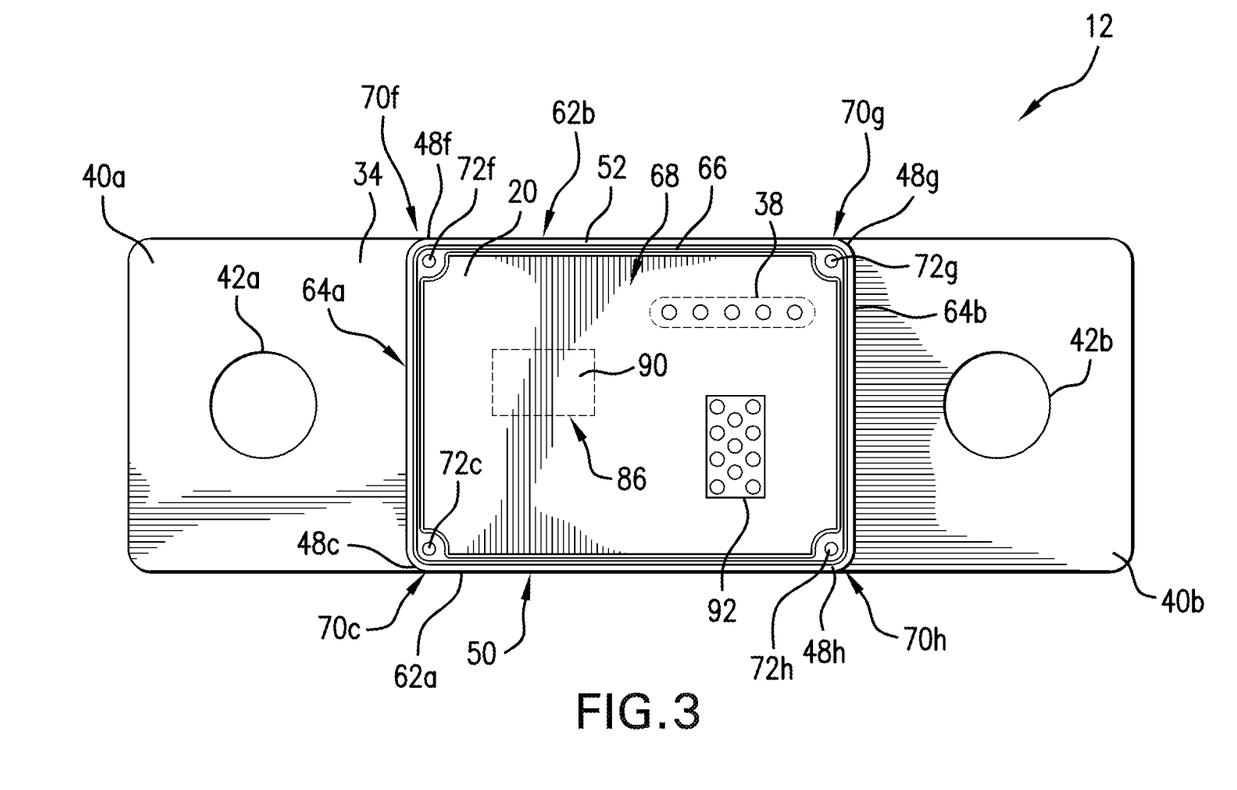
FIG. 3 is a plan view of a second surface of the busbar member with a second circuit board installed therein with a second cover removed.

With reference to FIGS. 1-3, the busbar member 12 is made of an electrically conductive material, for example, copper or aluminum. Further, the busbar member 12 may be coated with any number of substances, including for example, nickel. The busbar member 12 includes a base 30 with a first surface 32 facing in a first direction and a second surface 34 facing in a second direction. The first direction is opposite the second direction. A cross-section of the busbar member 12 can be manipulated to adjust the magnetic field strength near the magnetic field sensing components. However, as will be appreciated, there are practical limitations to adjusting the length and width of the busbar member 12.

The base 30 includes a floor portion 36 that can define a bore 38 and a pair of legs 40 $a,b$ that extend in opposite directions from one another from the floor portion 36. Further, the floor portion 36 and the legs 40 $a,b$ share a common horizontal plane. Additionally, as illustrated in FIGS. 2-3, the floor portion 36 and the legs 40 $a,b$ all share the first surface 32. Stated plainly, the first surface 32 is a collinear surface that extends between floor portion 36 and the legs 40 $a,b$ all facing in the same direction.

Further, the floor portion 36 and the legs 40 $a,b$ all share the second surface 34. Specifically, the second surface 34 is a collinear surface that extends between floor portion 36 and the legs 40 $a,b$ all facing in the same direction, which is opposite to the first surface 32. As also shown in FIGS. 2-3, the floor portion 36 and the legs 40 $a,b$ have a same width. It will be understood that the floor portion 36 and the legs 40 $a,b$ can have a same thickness as one another. In plan view, the legs 40 $a,b$ are of the same size as one another and can be rectangular in shape. The legs 40 $a,b$ each define an aperture 42 $a,b$, respectively, for receipt of studs to allow electricity to pass through the busbar member 12 to supply electricity to other components as will be described hereinafter.

With reference to FIGS. 1-2, a first boundary wall 44 extends from the first surface 32 of the base 30 in a direction away from the second surface 34 and terminates as a free end 46. As shown in FIG. 2, the first boundary wall 44 may define a rectangular shape when viewed from an axis that is orthogonal to the first surface 32. This rectangular shape includes corners 48 $a,b,c,d$. The rectangular shape allows for proper receipt of the first circuit board 18 and easy integration of the busbar current sensor assembly 10 into existing installations that were previously designed to accept conventional busbar members.

As shown in FIGS. 1 and 3, a second boundary wall 50 extends from the second surface 34 of the base 30 in a direction away from the first surface 32 and terminates as a free end 52. Thus, the first boundary wall 44 and the second boundary wall 50 extend from the base 30, and particularly the floor portion 36, in opposite directions from one another. As illustrated in FIG. 3, the second boundary wall 50 can define a rectangular shape when viewed from an axis that is orthogonal to the second surface 34. This rectangular shape includes corners 48 *e,f,g,h*. Like the first boundary wall 44, the rectangular shape of the second boundary wall 50 allows for proper receipt of the second circuit board 20 and easy integration of the busbar current sensor assembly 10 into existing installations that were previously designed to accept conventional busbar members. The base 30, the first boundary wall 44, and the second boundary wall 50 are all made of an electrically conductive material.

The first boundary wall 44 may include a pair of first sidewalls 54 *a,b* that are spaced from one another and a pair of first endwalls 56 *a,b* that are spaced from one another. The first sidewalls 54 *a,b* extend from the first surface 32 in the first direction and may be generally parallel to one another and the first endwalls 56 *a,b* can extend from the first surface 32 in the first direction so as to be generally parallel to one another. The first sidewalls 54 *a,b* extend in a longitudinal direction (i.e., in a same direction as an imaginary line that would connect the apertures 42 *a,b*) and the first endwalls 56 *a,b* extend in a lateral direction (i.e., orthogonal to the first sidewalls 54 *a,b*). This shape and alignment of the first sidewalls 54 *a,b* and the first endwalls 56 *a,b* help to control the magnetic field as will be described in more detail hereinafter.

As shown in FIGS. 1-2, the first boundary wall 44 can define a first ledge portion 58 for receipt of the first cover 22. The first boundary wall 44 and the first surface 32 cooperate to define a first cavity 60. Further, the first cover 22 is received by the first ledge portion 58 so as to enclose the first cavity 60. The first ledge portion 58 uniformly and continuously extends around the first boundary wall 44, including the pair of first sidewalls 54 *a,b* and the pair of first endwalls 56 *a,b* so as to allow for uniform and direct contact with the first cover 22. Because of this structure, the first cavity 60 is sealed to prevent the introduction of foreign bodies into the first cavity 60.

As shown in FIGS. 1 and 3, the second boundary wall 50 may include a pair of second sidewalls 62 *a,b* that are spaced from one another and a pair of second endwalls 64 *a,b* that are spaced from one another. The second sidewalls 62 *a,b* can extend from the second surface 34 in the second direction so as to be generally parallel to one another and the second endwalls 64 *a,b* extend from the second surface 34 in the second direction so as to be generally parallel to one another. The second sidewalls 62 *a,b* extend in the longitudinal direction (i.e., in a same direction as the imaginary line that would connect the apertures 42 *a,b*) and the second endwalls 64 *a,b* extend in the lateral direction (i.e., orthogonal to the second sidewalls 62 *a,b*). As shown in FIG. 1, the pair of second sidewalls 62 *a,b* can be collinear with the pair of first sidewalls 54 *a,b* and the pair of second endwalls 64 *a,b* can be collinear with the pair of first endwalls 56 *a,b*. This shape and alignment of the second sidewalls 62 *a,b* and the second endwalls 64 *a,b* help to control the magnetic field.

With reference to FIGS. 1 and 3, the second boundary wall 50 defines a second ledge portion 66. The second boundary wall 50 and the second surface 34 cooperate to define a second cavity 68. Additionally, the second cover 26 is received by the second ledge portion 66 so as to enclose the second cavity 68. The second ledge portion 66 uniformly and continuously extends around the second boundary wall 50, including the pair of second sidewalls 62 *a,b* and the pair of second endwalls 64 *a,b* so as to allow for uniform and direct contact with the second cover 26. Because of this structure, the second cavity 68 is sealed to prevent the introduction of foreign bodies into the second cavity 68.

The first cavity 60 defines a first cubic volume and the second cavity 68 defines a second cubic volume. The first cubic volume is equal to the second cubic volume. Because of the placement of the first cover 22 on the first ledge portion 58 and the second cover 26 on the second ledge portion 66, protection is provided to any component located within the first cavity 60 and second cavity 68, respectively. Further, due to this layout, the magnetic fields within the first cavity 60 and the second cavity 68 are more conducive to measurement for determination of the current flowing through the busbar member 12 as will be described hereinafter.

The rectangular shape of the first boundary wall 44 is a same size as the rectangular shape of the second boundary wall 50. The busbar member 12 includes the first cavity 60 and the second cavity 68 such that the second cavity 68 is disposed opposite the first cavity 60. Further still, the legs 40 *a,b* are disposed at opposite ends of the busbar member 12 such that the first cavity 60 and the second cavity 68 are disposed between the pair of legs 40 *a,b*. This arrangement ensures that proper magnetic field measurements can occur within the cavity.

As shown in FIG. 1, the bore 38 extends through the floor portion 36 of the base 30 so as to allow electrical communication between the first cavity 60 and the second cavity 68. Further, the apertures 42 *a,b* are external to the first cavity 60 and the second cavity 68 and extend through the base 30 in a same direction as the bore 38. As illustrated, the bore 38 has an elongated shape and the apertures 42 *a,b* are circularly shaped. These shapes allow for the proper passage and connection to various components as will be described hereinafter.

The busbar member 12 can also include a plurality of first bosses 70 *b,d* and second bosses 70 *e,f,g,h* that each define a fastener hole 72 *b,d,e,f,g,h* for receipt of the first fasteners 24 and the second fasteners 28. As shown in FIGS. 1-3, the first bosses 70 *b,d* are disposed at corners 48 *b,d* of the first boundary wall 44 and the second bosses 70 *e,f,g,h* are disposed at corners 48 *e,f,g,h* of the second boundary wall 50.

As illustrated in FIG. 1, the first insulator 14 has a generally rectangular shape that is complementary to the first cavity 60 so as to allow the first insulator 14 to directly contact the first surface 32 of the base 30, and more particularly, the floor portion 36 of the base 30. The second insulator 16 also has a generally rectangular shape that is complementary to the second cavity 68 so as to allow the second insulator 16 to directly contact the second surface 34 of the base 30, and more particularly, the floor portion 36 of the base 30. The first insulator 14 and the second insulator 16 may define cut-away corners for proper accommodation of the first bosses 70 *b,d* and second bosses 70 *e,f,g,h*. This ensures that the first insulator 14 and the second insulator 16 electrically isolate the first circuit board 18 and the second circuit board 20 from the current that is flowing through the busbar member 12.

The first insulator 14 and the second insulator 16 may each define a first slot 74 and second slot 76, respectively, to allow passage of various components as will be described hereinafter. As will be appreciated, the first insulator 14 and the second insulator 16 are made of an electrically insulative material, for example, Mylar, which is a plastic sheet product made from the resin Polyethylene Terephthalate (PET). The first insulator 14 and the second insulator 16 may be made of the same materials so as to minimize the cost of the production of the busbar current sensor assembly 10.

The first circuit board 18 includes a first current sensor 78 that is mounted thereto. The first current sensor 78 includes an inner surface 80 that faces the first surface 32 and an outer surface 82 that is opposite the inner surface 80. The inner surface 80 may be generally parallel to the first surface 32. The first current sensor 78 and the accompanying first circuit board 18 are located in the first cavity 60 such that the first current sensor 78 is disposed between the first cover 22 and the first surface 32. Further, the first current sensor 78 is disposed in the first cavity 60 such that the first cavity 60 at least partially surrounds the first current sensor 78. Further still, the first insulator 14 can be disposed between the first surface 32 and the first current sensor 78 so as to electrically separate the busbar member 12 and the first current sensor 78.

The first circuit board 18 can also include a differential amplifier integrated circuit 84. Operation of the differential amplifier integrated circuit 84 will be discussed in more detail hereinafter. The first circuit board 18 can be completely contained within the first cavity 60 such that the free end 46 of the first boundary wall 44 to the first surface 32 is greater than a distance from the first surface 32 to the first circuit board 18. Further, the pair of first sidewalls 54 *a,b* and the pair of first endwalls 56 *a,b* cooperate with one another to form a continuous perimeter around the first current sensor 78.

A second current sensor 86 is mounted to the second circuit board 20 such that the second cavity 68 at least partially surrounds the second current sensor 86. The second current sensor 86 includes an inner surface 88 that faces the second surface 34 and an outer surface 90 that is opposite the inner surface 88. The inner surface 88 of the second current sensor 86 may be generally parallel to the second surface 34. A distance between the second surface 34 and the free end 52 of the second boundary wall 50 is greater than a distance from the second surface 34 to the outer surface 90 of the second current sensor 86. Further, the pair of second sidewalls 62 *a,b* and the pair of second endwalls 64 *a,b* cooperate with one another to form a continuous perimeter around the second current sensor 86. Further still, the second insulator 16 disposed between the second surface 34 and the second current sensor 86. The second circuit board 20 can also include a connector 92 to receive friction pins (not shown) from an overmold member 100 as will be described hereinafter.

The first current sensor 78 and the second current sensor 86 can be of the same or similar construction and specifications. For example, the first current sensor 78 and the second current sensor 86 could be Hall effect integrated circuits (i.e., integrated circuits that each include a Hall effect sensor). As will be appreciated, a Hall effect sensor is a transducer that varies its output voltage in response to a magnetic field. The first current sensor 78 and the second current sensor 86 detect a magnitude of the magnetic field, thereby allowing a magnitude of the current to be determined. In particular, the first current sensor 78 and the second current sensor 86 are oriented to provide an output change of opposite polarity for the busbar member 12. The two outputs from the first current sensor 78 and the second current sensor 86 are applied to the differential amplifier integrated circuit 84. The differential amplifier integrated circuit 84 then performs a subtraction function. Specifically, the differential amplifier integrated circuit 84 subtracts one signal from the other, thereby eliminating the influence of any external magnetic fields resulting from nearby magnetic sources like power conductors and relays. The output from the differential amplifier integrated circuit 84 is proportional to the current in the busbar member 12, and external magnetic field interference is greatly reduced.

The busbar member 12 cross section geometry can be manipulated to adjust the magnetic field strength near the first current sensor 78 and the second current sensor 86. The first boundary wall 44 and the second boundary wall 50, which define the first cavity 60 and the second cavity 68, respectively, not only reduce the magnetic field in the vicinity of the first current sensor 78 and the second current sensor 86, respectively, but also make the magnetic field more uniform. This also eliminates the need for a hole to be drilled in the busbar member to reduce the magnetic field strength in the vicinity of the current sensors.

As will be appreciated, elimination of the hole in the busbar member to reduce the magnetic field strength near the current sensors has numerous advantages. For example, less manufacturing work is required, as the hole does not have to be created. Additionally, precise placement of the current sensors, so as to be aligned with the hole, are not needed. Thus, the busbar current sensor assembly 10 can be manufactured more quickly.

The busbar current sensor assembly 10 can also include a board-to-board header 94. The board-to-board header 94 extends through the bore 38 to electrically connect the first current sensor 78 and the second current sensor 86. Thus, the board-to-board header 94 electrically connects the first circuit board 18 and the second circuit board 20. The board-to-board header 94 may include a plurality of electrically conductive pins 96. As illustrated, the conductive pins 96 are cylindrical in shape. The conductive pins 96 are at least partially surrounded by insulator blocks 98 so as to electrically insulate the conductive pins 96 from the base 30. As will be appreciated, the insulator blocks 98 are cube-shaped and made of an electrically insulative material.

As shown in FIG. 1, the board-to-board header 94 is disposed at an end of the first circuit board 18 and the second circuit board 20 that is opposite to an end to which the first current sensor 78 and the second current sensor 86 are mounted, respectively. This spacing prevents interference from occurring. In particular, by locating the board-to-board header 94 so as to be at an opposite end as the first current sensor 78 and the second current sensor 86, the magnetic field near the first and second current sensors 78, 86 is not disturbed.

The first cover 22 and the second cover 26 are of an electrically insulative material. The first cover 22 covers the first cavity 60 and is directly attached to the first boundary wall 44 with the first fasteners 24 that engage the bosses 70 *b,d* that are disposed at the corners 48 *b,d* of the first boundary wall 44. The second cover 26 covers the second cavity 68 and is directly attached to the second boundary wall 50 with the second fasteners 28 that engage the bosses 70 *e,f,g,h* that are disposed at the corners 48 *e,f,g,h* of the second boundary wall 50. Thus, the first current sensor 78 is disposed between the first cover 22 and the second cover 26 and the second current sensor 86 is disposed between the second cover 26 and the second surface 34.

After the second fasteners 28 are used to fasten the second cover 26 to the busbar member 12, an overmold member 100 is placed over the second cover 26 to provide additional environmental protection to the busbar member 12 and the components located therewithin. The overmold member 100 allows for the passage of a cable 102 therethrough as will be described hereinbelow. As noted hereinbefore, the overmold member 100 can include friction pins (not shown) for attaching the overmold member 100 to the second circuit board 20.

Figure 4:
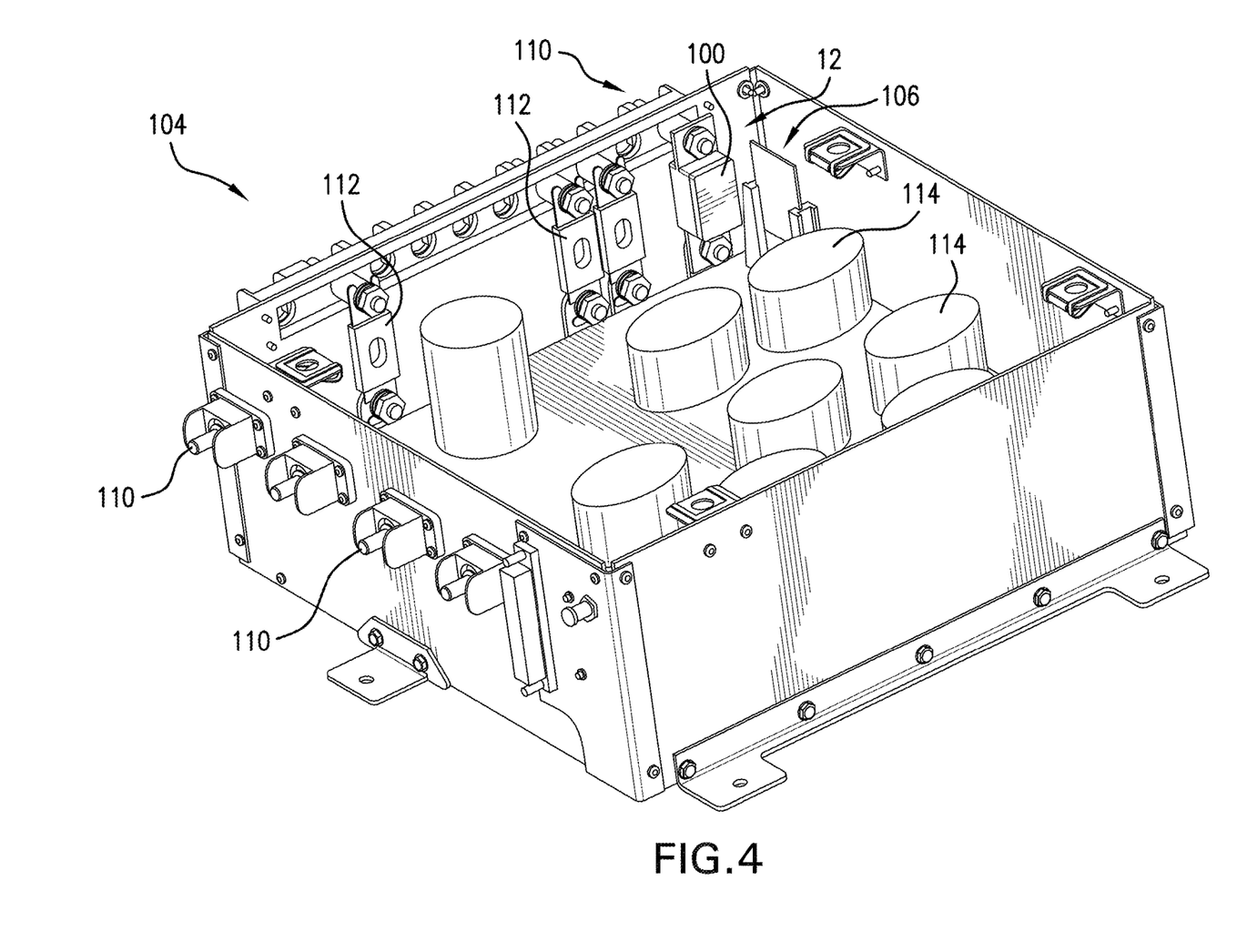
FIG. 4 is a schematic perspective view of the busbar current sensor assembly in a power distribution box.

With reference to FIG. 4, a power distribution box 104 including the busbar current sensor assembly 10 and a power supply PCB assembly 106 is shown. The power distribution box 104 can be used for a variety of purposes including, for example, redistributing electrical power between circuits. As will be appreciated, this electrical power could be quite large, for example in excess of 400 A.

The power supply PCB assembly 106 is connected to the second circuit board 20 with the cable 102 that extends through the overmold member 100 and the second cover 26. The power supply PCB assembly 106 supplies nominal power to the first and second circuit boards 18, 20 for their operation. Additionally, the power supply PCB assembly 106 can be used for EMI/lighting protection of the power distribution box 104. The power supply PCB assembly 106 can also include a communications port 108 to allow communication between the power supply PCB assembly 106 and various other non-illustrated components.

As shown, the power distribution box 104 includes a number of terminals 110. These terminals 110 can be used for supplying power to the power distribution box 104 or for outputting power from the power distribution box 104. As will be appreciated, the power distribution box 104 can include a number of components including, for example, fuses 112 and contactors 114.

A busbar current sensor assembly has been described above in particularity. Modifications and alternations will occur to those upon reading and understanding the preceding detail description. The invention, however, is not limited to only the embodiment described above. Instead, the invention is broadly defined by the appended claims and the equivalents thereof.

The invention claimed is:

1. A busbar current sensor assembly, comprising:
  a busbar member including
    a base including a first surface facing in a first direction and a second surface facing in a second direction, the first direction being opposite the second direction,
    a first boundary wall extending from the first surface of the base in a direction away from the second surface, the first boundary wall and the first surface cooperating to define a first cavity, and
    a second boundary wall extending from the second surface of the base in a direction away from the first surface, the second boundary wall and the second surface cooperating to define a second cavity;
  a first current sensor disposed in the first cavity;
  a second current sensor disposed in the second cavity;
  a first cover; and
  a second cover, wherein the first boundary wall defines a first ledge portion and the second boundary wall defines a second ledge portion, and wherein the first ledge portion receives the first cover and the second ledge portion receives the second cover so as to enclose the first cavity and the second cavity, respectively.

2. The busbar current sensor assembly of claim 1, wherein a distance between the first surface and a free end of the first boundary wall is greater than a distance from the first surface to an outer surface of the first current sensor and wherein a distance between the second surface and a free end of the second boundary wall is greater than a distance from the second surface to an outer surface of the second current sensor.

3. The busbar current sensor assembly of claim 1, wherein the first cover and the second cover are of an electrically insulative material.

4. The busbar current sensor assembly of claim 1, wherein the first current sensor is disposed between the first cover and the first surface and the second current sensor is disposed between the second cover and the second surface, and wherein the first current sensor is disposed between the first cover and the second cover.

5. The busbar current sensor assembly of claim 1,
  wherein the first boundary wall includes a pair of first sidewalls that are spaced from one another and a pair of first endwalls, that are spaced from one another, the pair of first sidewalls and the pair of first endwalls cooperating with one another to form a continuous perimeter around the first current sensor, and
  wherein the second boundary wall includes a pair of second sidewalls that are spaced from one another and a pair of second endwalls that are spaced from one another, the pair of second sidewalls and the pair of second endwalls cooperating with one another to form a continuous perimeter around the second current sensor.

6. The busbar current sensor assembly of claim 5,
  wherein the first sidewalls extend from the first surface in the first direction so as to be generally parallel to one another and the first endwalls extend from the first surface in the first direction so as to be generally parallel to one another,
  wherein the second sidewalls extend from the second surface in the second direction so as to be generally parallel to one another and the second endwalls extend from the second surface in the second direction so as to be generally parallel to one another, and
  wherein the pair of second sidewalls are collinear with the pair of first sidewalls and the pair of second endwalls are collinear with the pair of first endwalls.

7. The busbar current sensor assembly of claim 1, further comprising:
  a first insulator disposed between the first surface and the first current sensor; and
  a second insulator disposed between the second surface and the second current sensor.

8. The busbar current sensor assembly of claim 1, wherein the base defines a bore that extends between the first cavity and the second cavity so as to allow electrical communication between the first current sensor and the second current sensor.

9. The busbar current sensor assembly of claim 8, wherein the base defines a plurality of apertures that are external to the first cavity and the second cavity and extend through the base in a same direction as the bore.

10. The busbar current sensor assembly of claim 8, further comprising:
  a board-to-board header that extends through the bore to electrically connect the first current sensor and the second current sensor, wherein the board-to-board header includes a plurality of electrically conductive pins that are at least partially surrounded, by an insulator block so as to electrically insulate the conductive pins from the base.

11. The busbar current sensor assembly of claim 1, wherein the first cavity defines a first cubic volume and the second cavity defines a second cubic volume, and wherein the first cubic volume is equal to the second cubic volume.

12. The busbar current sensor assembly of claim 1, wherein the first boundary wall defines a rectangular shape when viewed from an axis that is orthogonal to the first surface and the second boundary wall defines a rectangular shape when viewed from an axis that is orthogonal to the second surface.

13. The busbar current sensor assembly of claim 12, wherein the rectangular shape of the first boundary wall is a same size as the rectangular shape of the second boundary wall.

14. The busbar current sensor assembly of claim 12, further comprising:
- a plurality of bosses that each define a fastener hole, wherein one boss of the plurality of bosses is disposed at at least some corners of the rectangular shape of the first boundary wall and the rectangular shape of the second boundary wall;
- a first cover that covers the first cavity and is directly attached to the first boundary wall with first fasteners that engage the bosses that are disposed at the corners of the first boundary wall; and
- a second cover that covers the second cavity and is directly attached to the second boundary wall with second fasteners that engage the bosses that are disposed at the corners of the second boundary wall.

15. The busbar current sensor assembly of claim 1, wherein the first current sensor is a Hall effect integrated circuit that is mounted to a first circuit board that also includes a differential amplifier integrated circuit, the first circuit board being completely contained within the first cavity such that a free end of the first boundary wall is greater than a distance from the first surface to the first circuit board.

16. The busbar current sensor assembly of claim 1, further comprising:
- a first circuit board disposed in the first cavity, wherein the first current sensor is mounted to the first circuit board;
- a second circuit board disposed in the second cavity, wherein the second current sensor is mounted to the second circuit board; and
- a board-to-board header that electrically connects the first circuit board and the second circuit board, wherein the board-to-board header is disposed at an end of the first circuit board and the second circuit board that is opposite to an end to which the first current sensor and the second current sensor are mounted, respectively.

17. The busbar current sensor assembly of claim 1, wherein the base, the first boundary wall, and the second boundary wall are all made of an electrically conductive material.

18. A busbar current sensor assembly, comprising:
- a busbar member including a first cavity and a second cavity, the second cavity being disposed opposite the first cavity; and
- a first current sensor disposed in the first cavity such that the first cavity at least partially surrounds the first current sensor;
- a second current sensor disposed in the second cavity such that the second cavity at least partially surrounds the second current sensor;
- a pair of legs disposed at opposite ends of the busbar member, wherein the first cavity and the second cavity are disposed between the pair of legs.

19. A busbar current sensor assembly, comprising:
- a busbar member including
  - a base including a first surface facing in a first direction and a second surface facing in a second direction, the first direction being opposite the second direction,
  - a first boundary wall extending from the first surface of the base in a direction away from the second surface, the first boundary wall and the first surface cooperating to define a first cavity, and
  - a second boundary wall extending from the second surface of the base in a direction away from the first surface, the second boundary wall and the second surface cooperating to define a second cavity;
- a first current sensor disposed in the first cavity; and
- a second current sensor disposed in the second cavity, wherein a distance between the first surface and a free end of the first boundary wall is greater than a distance from the first surface to an outer surface of the first current sensor and wherein a distance between the second surface and a free end of the second boundary wall is greater than a distance from the second surface to an outer surface of the second current sensor.

20. The busbar current sensor assembly of claim 19, wherein the base defines a bore that extends between the first cavity and the second cavity so as to allow electrical communication between the first current sensor and the second current sensor.

* * * * *